(12) United States Patent
Song et al.

(10) Patent No.: US 6,699,769 B2
(45) Date of Patent: Mar. 2, 2004

(54) METHOD FOR FABRICATING CAPACITOR USING ELECTROCHEMICAL DEPOSITION AND WET ETCHING

(75) Inventors: Chang-Rock Song, Ichon-shi (KR); Hyung-Bok Choi, Ichon-shi (KR)

(73) Assignee: Hynix Semiconductor Inc., Ichon-shi (KR)

(*) Notice: Subject to any disclaimer, the term of this patent is extended or adjusted under 35 U.S.C. 154(b) by 0 days.

(21) Appl. No.: 10/330,353

(22) Filed: Dec. 30, 2002

(65) Prior Publication Data

US 2003/0203570 A1 Oct. 30, 2003

(30) Foreign Application Priority Data

Apr. 26, 2002  (KR) ........................................ 2002-23023

(51) Int. Cl.[7] .............................................. H01L 21/20
(52) U.S. Cl. ...................................... 438/399; 438/754
(58) Field of Search ................................ 438/253, 396, 438/399, 704, 754, 763, 768, 675, FOR 100, FOR 128, FOR 339, FOR 220, FOR 212, FOR 430; 148/DIG. 14

(56) References Cited

U.S. PATENT DOCUMENTS

| | | |
|---|---|---|
| 6,284,655 B1 | 9/2001 | Marsh |
| 6,403,414 B2 | 6/2002 | Marsh |
| 6,420,742 B1 | 7/2002 | Ahn et al. |
| 2003/0136668 A1 * | 7/2003 | Kobata et al. .............. 204/242 |

* cited by examiner

Primary Examiner—George Fourson
Assistant Examiner—Thanh V Pham
(74) Attorney, Agent, or Firm—Jacobson Holman PLLC

(57) ABSTRACT

Provided is a method for fabricating a capacitor using an electrochemical deposition method and $Ce(NH_4)_2(NO_3)_6$ solution. The method includes the steps of: a) forming a contact hole in an insulation layer on a substrate; b) forming a plug including nitride in the contact hole; c) forming a Ru seed layer in the contact hole and on the insulation layer; d) forming a sacrificial layer including an open area overlapped with the contact hole on the Ru seed layer; e) forming a Ru layer for an electrode of the capacitor in the open area by performing electrochemical deposition; f) removing the sacrificial layer, whereby the Ru seed layer not covered with the Ru layer is exposed; and g) etching the exposed Ru seed layer by using an aqueous solution including $Ce(NH_4)_2(NO_3)_6$.

18 Claims, 8 Drawing Sheets

METHOD FOR FABRICATING CAPACITOR USING ELECTROCHEMICAL DEPOSITION AND WET ETCHING

FIELD OF THE INVENTION

The present invention relates to a method for fabricating a capacitor of a semiconductor device; and, more particularly, to a method for fabricating a capacitor using an electrochemical deposition method and $Ce(NH_4)_2(NO_3)_6$ solution.

DESCRIPTION OF RELATED ART

At present, semiconductor memory devices are largely divided into a random access memory (RAM) and a read-only memory (ROM). Particularly, RAM is divided again into a dynamic RAM (DRAM) and a static RAM. Among them, DRAM which is composed of unit cells, each including a transistor and a capacitor, is most favorable for high degree of integration and, accordingly, DRAM is leading the semiconductor memory market.

Meanwhile, due to the great progress in the degree of integration, the capacity of a memory has increased four times as high as it used to be three years ago. Nowadays, 256 mega or 1 giga-class DRAM is about to be mass-produced.

As the integration of DRAM becomes higher, the memory cell area should be smaller. In case of 256M DRAM, the memory cell area should be less than 0.5 $\mu m^2$, and its capacitor area, which is a basic constituent of the cell, should become less than 0.3 $\mu m^2$. For this reason, the technology used in the conventional processing for a semiconductor over 256M DRAM is now facing a technological limitation.

That is, when a capacitor used in a 64M DRAM is fabricated using such a dielectric material as $SiO_2/Si_3N_4$, in order to secure the required capacitance, the area occupied by the capacitor becomes more than six times as big as the cell area, even though it is assumed that the thin films of the capacitor are formed thinnest.

Accordingly, researchers are studying to seek a method for increasing the surface area of a capacitor to secure the required capacitance. To increase the surface area of a bottom electrode of the capacitor, various technologies using a three-dimensional stacked capacitor, trench-type capacitor or hemispherical polysilicon layer are suggested.

However, when a capacitor is fabricated using such a conventional dielectric material as oxide nitride oxide (ONO) in a semiconductor memory device over 256M DRAM, the capacitance cannot be increased more than that, because the thin film cannot be any thinner. Also, since the structure of the capacitor cannot be made more complex than now, the surface area of the capacitor cannot be increased any further, either. This is because the complex structure makes the process too complicated, as well as causing a problem of high production cost and dropping throughput.

To solve the above problems, dielectric materials having a higher dielectric constant than the conventional ONO dielectric material are adopted as a dielectric substance for the capacitor. The newly adopted high dielectric materials includes $Ta_2O_5$, $(Ba,Sr)TiO_3$ (BST), $Al_2O_3$, $SrTiO_3$, and TaON.

However, the dielectric constant of the above high dielectric materials changes according to what material is used for a bottom electrode of the capacitor. As far as found out, the dielectric characteristic becomes best when the high dielectric material is put on metal.

Accordingly, such metal as Pt, Ir, Rh and Ru are used for an electrode of the capacitor, instead of polysilicon which has been used for a bottom electrode conventionally.

When a metallic material is used for an electrode of a capacitor, the biggest problem in the capacitor fabrication process is the etching of the metallic material, which is for the bottom electrode of the capacitor.

Referring to FIGS. 1A to 1E, a conventional method for forming a Ru bottom electrode using a metal organic chemical vapor deposition (MOCVD) method. First, with reference to FIG. 1A, a first inter-layer insulation layer 11 is formed on a semiconductor substrate 10, which is completed with a predetermined process, such as formation of transistor and bit lines. Then, a contact hole is formed to expose a predetermined surface of the semiconductor substrate 10 by etching the first inter-layer insulation layer 11.

With reference to FIG. 1B, a polysilicon 12 is formed on the first inter-layer insulation layer 11 including the contact hole. Then, the polysilicon is recessed in a predetermined depth by performing etch-back to form a polysilicon plug 12 buried in a predetermined part of the contact hole.

Subsequently, titanium (Ti) is deposited on the entire surface of the substrate including the contact hole, and rapid thermal process (RTP) is performed to make the silicon atoms of the polysilicon plug 12 react with the titanium to form a titanium silicide (Ti-silicide) 13 on the polysilicon plug 12. The remaining non-reacted titanium is removed. Here, the titanium silicide 13 forms an ohmic contact with the polysilicon plug 12 and the subsequent bottom electrode.

Subsequently, a titanium nitride (TiN) 14 is formed on the entire structure including the contact hole. Then, the titanium nitride 14 remains only in the contact hole by performing chemical-mechanical polishing (CMP) or etch-back, until the surface of the first inter-layer insulation layer 11 is exposed. Here, the titanium nitride 14 performs the role of a barrier layer for preventing the diffusion of materials between the bottom electrode and the polysilicon plug 12 or the semiconductor substrate 10, or for preventing the diffusion of oxygen in the subsequent annealing process.

Referring to FIG. 1C, an oxide layer 15 is deposited on the entire structure, which is obtained by completing the above processes and includes the first inter-layer insulation layer 11 and the titanium nitride 14, to form a bottom electrode. Then, a trench 16 is formed by going through masking and etching processes.

Referring to FIG. 1D, a ruthenium (Ru) bottom electrode 17 is deposited by performing MOCVD on the entire surface including the trench 16. Then, with reference to FIG. 1E, the Ru bottom electrode 17 is removed except the Ru bottom electrode deposited on the inside of the trench to thereby isolate the bottom electrode.

Referring to FIG. 1F, a high dielectric thin film 18 and a top electrode 19 are formed sequentially on the entire structure including the Ru bottom electrode 17. This way, the capacitor fabrication process is completed.

The Ru bottom electrode which is deposited in the MOCVD method has a shortcoming that the fine thin film is not obtained, because the deposition process is performed at a low temperature. However, when RTP is performed in the hope of making the thin film fine, the Ru thin film becomes cracked.

If the Ru bottom electrode is cracked, the titanium nitride under the Ru bottom electrode is exposed. The exposed nitride forms a thin film having a low dielectric constant, and during the annealing, oxidation is performed, thus dropping the performance of the capacitor. This problem is inevitable as long as the Ru thin film is deposited at a low temperature to enhance the step coverage of the Ru thin film.

Moreover, when the Ru thin film is deposited at a low temperature, high step coverage is required to form a dielectric thin film and a top electrode successively in the trench as well as the Ru bottom electrode.

Therefore, the Ru bottom electrode has a limitation in its thickness, and when the bottom electrode is too thin, the characteristic as an electrode is dropped. Particularly, this becomes a big problem, as the degree of the integration becomes higher. Thus, a new method for forming a bottom electrode to overcome the limitation is required.

The methods for forming a bottom electrode are represented by a method that forms a platinum (Pt) electrode using electrochemical deposition. However, this method has a shortcoming that the leakage current of the Pt bottom electrode is not stable to the high dielectric materials, just except $(Ba,Sr)TiO_3$ (BST). So, it is not widely applied.

In conclusion, among the methods for forming a bottom electrode using the various high dielectric materials, the method for forming Ru bottom electrode using electrochemical deposition is the most likely to be used widely.

The method for forming a Ru bottom electrode using electrochemical deposition has such an advantage that a fine bottom electrode could be obtained, but it also has following problems.

A Ru bottom electrode grown from a seed layer having the same-class noble metal, such as Pt, Ru and Ir, should be separated from the adjacent bottom electrodes by removing the exposed seed layer after the formation of the bottom electrode, and when the seed layer is removed in a reactive ion etching method, the upper part of the Ru bottom electrode, which is formed with a great deal of effort, is etched more than the seed layer.

In addition, when a reactive ion etching is applied to the seed layer formed of noble metal that is not etched in the reactive ion etching method, such as Pt, Ir and the like, the Pt or Ir is rather re-deposited in the form of polymer on the sides of the Ru bottom electrode, thus dropping the performance of the bottom electrode. In this case, it is necessary to perform an additional process for removing the re-deposited noble metal.

Therefore, a technology for removing the seed layer using wet etching is in need. Since the Pt or Ir is not dissolved in a solution, when it is in the form of metal, Ru should be used for the seed layer. Ru can be removed easily through the oxidation and reduction reaction between ions in an aqueous solution.

SUMMARY OF THE INVENTION

It is, therefore, an object of the present invention to provide a method for fabricating a capacitor using an electrochemical deposition method and a wet etching using $Ce(NH_4)_2(NO_3)_6$ solution, the method being favorable for the fabrication of a highly integrated semiconductor device and enhancing step coverage and the performance of the electrodes.

In accordance with an aspect of the present invention, there is provided a method for fabricating a capacitor, comprising the steps of: a) forming a contact hole in an insulation layer on a substrate; b) forming a plug including nitride in the contact hole; c) forming a Ru seed layer in the contact hole and on the insulation layer; d) forming a sacrificial layer including an open area overlapped with the contact hole on the Ru seed layer; e) forming a Ru layer for an electrode of the capacitor in the open area by performing electrochemical deposition; f) removing the sacrificial layer, whereby the Ru seed layer not covered with the Ru layer is exposed; and g) etching the exposed Ru seed layer by using an aqueous solution including $Ce(NH_4)_2(NO_3)_6$.

Conventionally, the Ru thin film formed in an electrochemical method has been applied to the surface treatment of jewels and noble metal. The Ru thin film formed in an electrochemical method is firm and strong to corrosion and low resistance. So, it is very suitable for a bottom electrode of a capacitor in a semiconductor device.

When the electrochemical method is used, the thin film is deposited optionally on the part where a conductive metal is exposed. Also, the electrolyte used in the electrochemical method can be reused at any time. Therefore, the electrochemical method is more favorable in the matter of cost than the metalorganic chemical vapor deposition.

When the electrochemical deposition is used, the surface step coverage as fine as that obtained by performing chemical vapor deposition (CVD) can be secured. Also, films are formed on an atom basis, just as in the physical vapor deposition method, such as sputtering, so very fine thin film can be obtained. Therefore, the electrochemical deposition method has an advantage that the thin film is not cracked in the subsequent thermal treatment, which is different from the Ru thin film formed in the metal organic chemical vapor deposition.

Also, when the Ru thin film formed in the metal organic chemical vapor deposition is used as a seed layer for flowing electricity, although the Ru seed layer is cracked after annealing, there is an advantage that the cracked gap can be filled in delicately with Ru by performing electrochemical deposition. This advantage makes the electrochemical deposition a powerful method that can be applied to the fabrication of a capacitor used in the next-generation DRAM.

In the present invention, a Ru bottom electrode is formed in the electrochemical deposition method, and then the Ru bottom electrode is isolated by using an aqueous solution containing cerium ammonium nitrate ($Ce(NH_4)_2(NO_3)_6$: CAN). Also, the space between the bottom electrodes can be widened by etching the surface of the Ru bottom electrode along with the Ru seed layer to thereby secure subsequent process margin, when the Ru bottom electrode is isolated.

In an embodiment of the present invention, the Ru seed layer and the Ru bottom electrode are etched simultaneously using a mixture solution of CAN, $HNO_3$, and deionized water. The mechanism of this wet etching method is that Ru is oxidized into $Ru(OH)x$ and the Ru thin film is corroded, as Cr is changed from quadravalence (+4) to trivalence (+3).

Here, the nitride prevents CAN from being hydrated in the deionized water. The Ru is removed completely by dipping the semiconductor substrate in a solution having CAN and cleaning it for about 10 seconds in a deluted HF solution ($HF:H_2O=1:500$).

The purpose of the cleaning processing using HF solution is to remove the by-products generated in the wet etching process using CAN. Since the HF is used only for about 10 seconds, the oxide layer under the Ru bottom electrode is not damaged.

Since the CAN-containing solution dissolves Ru but it does not dissolve silicon oxide or conductive nitride, the CAN-containing solution is very suitable for the purpose of the present invention.

In this invention, Ru salt is dissolved in an aqueous solution and used as an electrolyte. The Ru salt mainly used here includes ruthenium sulfamate and ruthenium nitrosyl sulfamate.

BRIEF DESCRIPTION OF THE DRAWINGS

The above and other objects and features of the present invention will become apparent from the following description of the preferred embodiments given in conjunction with the accompanying drawings, in which:

FIGS. 2A to 2I are cross-sectional views describing a method for fabricating a capacitor in accordance with an embodiment of the present invention.

DETAILED DESCRIPTION OF THE INVENTION

Other objects and aspects of the invention will become apparent from the following description of the embodiments with reference to the accompanying drawings, which is set forth hereinafter.

Figure 1A:
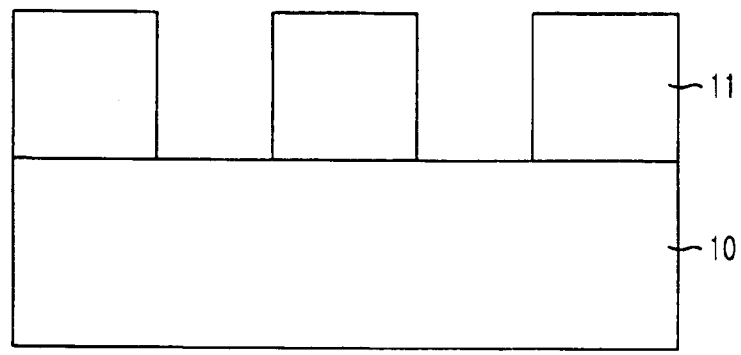
FIGS. 1A to 1F are cross-sectional views illustrating a conventional method for fabricating a capacitor.
Figure 1B:
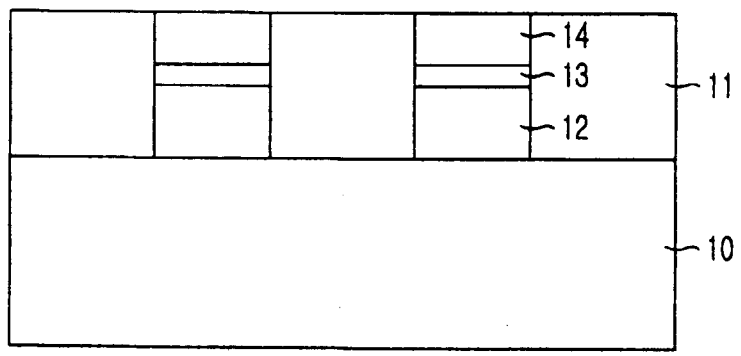
Figure 1C:
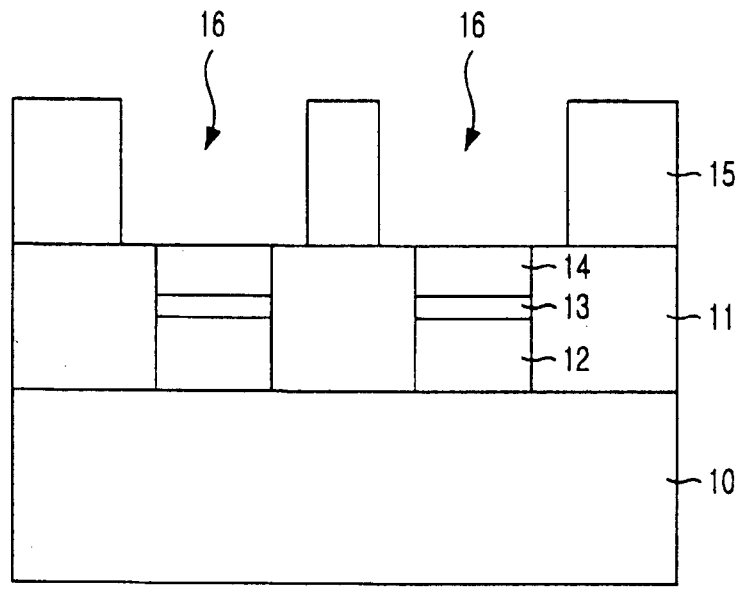
Figure 1D:
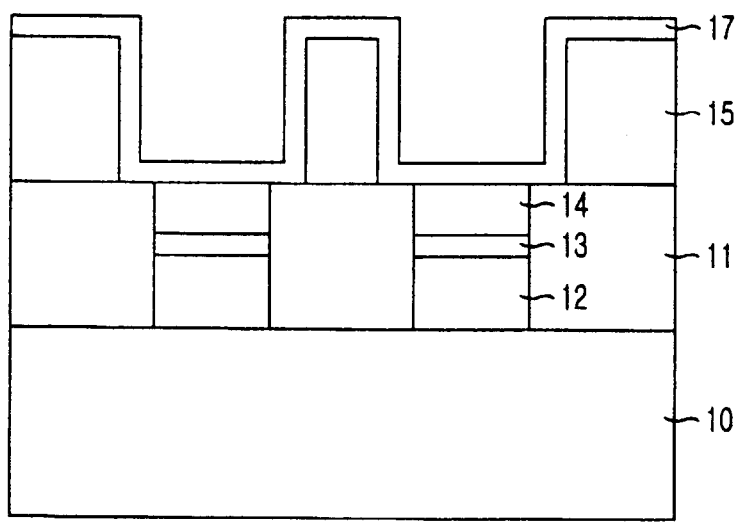
Figure 1E:
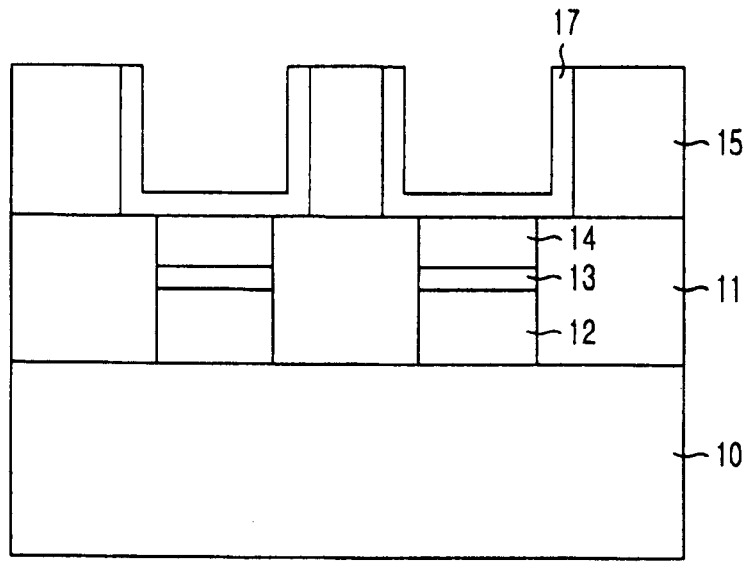
Figure 1F:
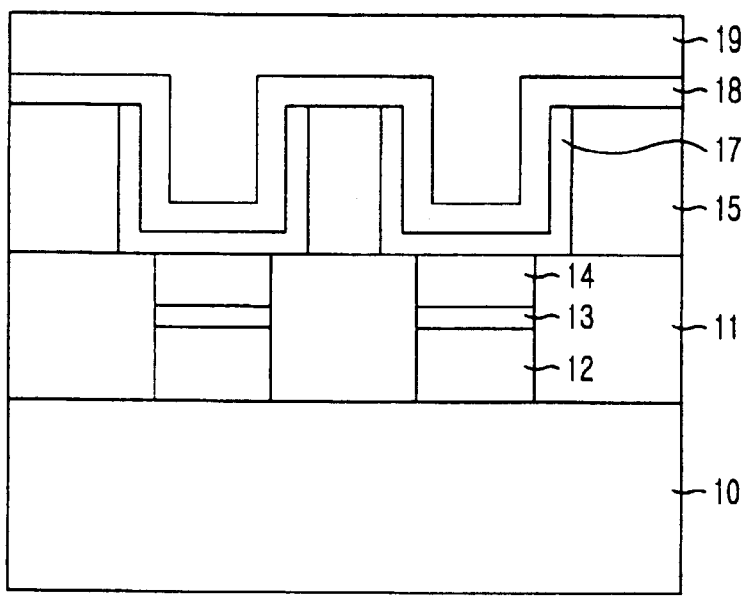
Figure 2A:
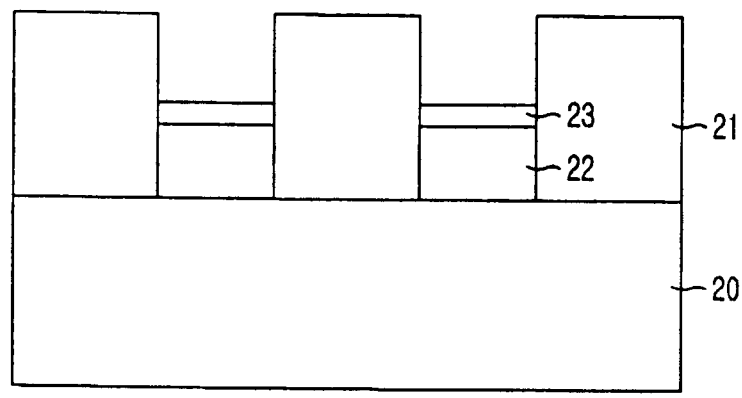

FIGS. 2A to 2I are cross-sectional views describing a method for fabricating a capacitor in accordance with an embodiment of the present invention. Referring to FIG. 2A, first, a first inter-layer insulation layer 21 is formed on a semiconductor substrate 20, which is completed with a predetermined process. Then, a contact hole is formed to expose a predetermined surface of the semiconductor substrate 20 by performing masking and etching. Here, the exposed surface of the substrate becomes a silicon substrate on which implant is performed, doped polysilicon, or a silicon formed in an epitaxial method.

Subsequently, a polysilicon 22 is formed on the first inter-layer insulation layer 21 including the contact hole. Then, the polysilicon is recessed in a predetermined depth by performing etch-back to form a polysilicon plug 22 buried in a predetermined part of the contact hole. Although an embodiment of the present invention adopts a polysilicon plug, tungsten plug may be used.

A titanium silicide (Ti-silicide) 23 is formed in a thickness of 50~500 Å by depositing titanium on the entire surface of the substrate including the contact hole and performing a rapid thermal process (RTP) to thereby induce the reaction between the silicon atoms of the polysilicon plug 22 and the titanium. A titanium nitride layer may be formed additionally on titanium or cobalt in a thickness of 100~300 Å to stabilize the formation of the silicide.

Here, the titanium silicide 23 forms an ohmic contact between the polysilicon plug 22 and the subsequent bottom electrode. Besides titanium, the silicide layer may also be formed of cobalt. Non-reacted titanium is removed in a wet etching method by using hydrogen peroxide solution containing sulfuric acid or ammonium peroxide.

Figure 2B:
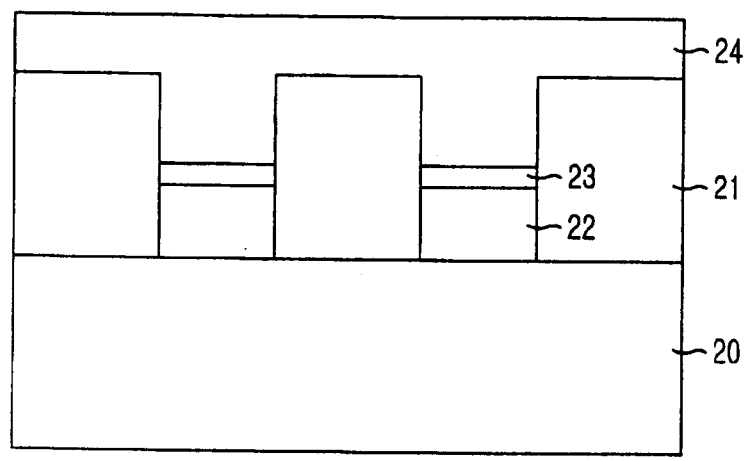

With reference to FIG. 2B, a titanium nitride (TiN) 24 is formed in a thickness of 500~2000 Å on the entire structure including the contact hole. Then, 200~1000 Å of the titanium nitride (TiN) 24 is removed by performing chemical mechanical polishing (CMP), and at the same time, the first inter-layer insulation layer 21 is made planar. Subsequently, part of the titanium nitride (TiN) 24 inside the contact hole is removed through an etch-back process so that the titanium nitride (TiN) 24 should remain only in the contact hole.

Otherwise, the titanium nitride (TiN) 24 is formed in a thickness of 500~2000 Å, and then part of the titanium nitride (TiN) 24 inside the contact hole is removed by performing an etch-back process so that the titanium nitride (TiN) 24 should remain only in the contact hole.

The titanium nitride (TiN) 24 prevents diffusion of materials between the bottom electrode and the polysilicon plug 23 or the substrate 20 during the subsequent annealing process. It also performs the role of a barrier layer that prevents the diffusion of oxygen. In the embodiment of the present invention the titanium nitride (TiN) is used as a barrier layer. However, TiAlN, TiSiN, TaSiN and TaAlN can be used as a barrier layer, other than TiN.

Figure 2C:
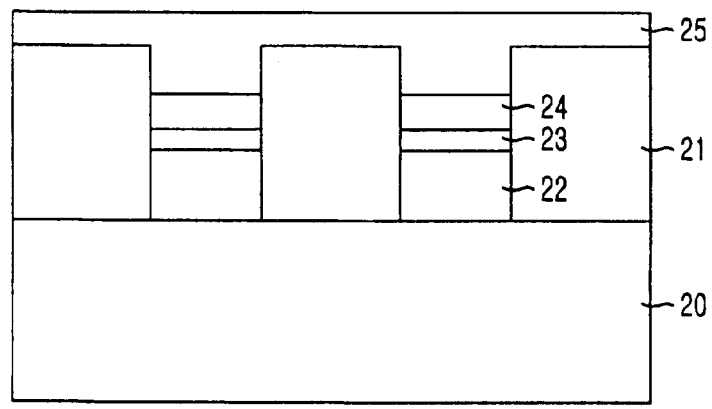

Referring to FIG. 2C, a seed layer 25 for forming a Ru bottom electrode is formed on the entire structure including the first inter-layer insulation layer 21 and the titanium nitride 24.

Since part of the seed layer will be removed using CAN solution in the subsequent process, the seed layer is formed in a thickness of 500~2000 Å by performing sputtering or metal organic chemical deposition.

As shown in FIG. 2C, if the Ru seed layer 25 is formed on the entire structure that includes the first inter-layer insulation layer 21 and the titanium nitride 24, degradation in the characteristics of the capacitor that can be generated by misalignment between the contact hole and the subsequent bottom electrode can be prevented. This is because the Ru seed layer 25 formed in the contact hole prevents the exposure of the titanium nitride 24.

After the Ru seed layer 25 is formed, part of the Ru seed layer 25 may be removed to control the thickness of the Ru seed layer 25 through an etch-back process or chemical mechanical polishing.

That is, since the contact hole is filled in with the polysilicon plug 22, titanium silicide 23, barrier layer (i.e., titanium nitride layer) 24 and part of the Ru seed layer 25, although the contact hole and the bottom electrode are misaligned in the subsequent process, the nitride layer is protected from the exposure and thus not oxidized.

Figure 2D:
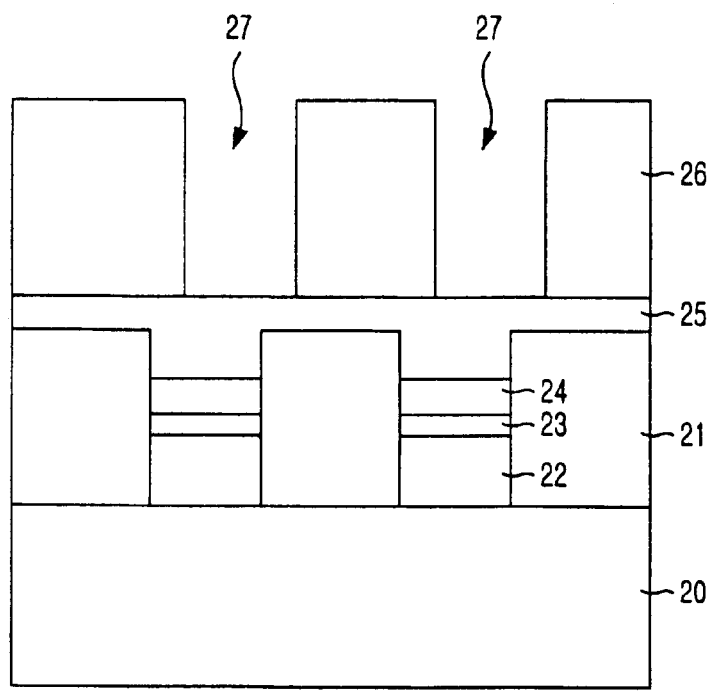

Referring to FIG. 2D, a sacrificial layer 26 for forming the bottom electrode is formed on top of the Ru seed layer 25. Materials that can be used for forming the sacrificial layer 26 include all kinds of glass silicon oxides, such as USG, PSG, TEOS, HTO, PE-TEOS, SOG and the like. Also, the sacrificial layer 26 can be formed using a photoresist or polymer having a low dielectric constant (low-k).

The sacrificial layer 26 for forming a bottom electrode is formed in a thickness of 5000~20000 Å by performing a conventional chemical vapor deposition, spin-coating, spraying or plasma spray coating method.

Before the sacrificial layer 26 is formed, an adhesive layer (not shown) may be formed on the Ru seed layer 25 to increase the adhesiveness between the Ru seed layer 25 and the sacrificial layer 26. As for the adhesive layer, TiN or $Al_2O_3$ may be used. The adhesive layer is formed in a thickness of 50~200 Å by performing sputtering or atomic layer deposition.

After the sacrificial layer 26 is formed, it is etched in a conventional method by using a silicon oxide layer, $Al_2O_3$, or TiN layer as a hard mask (not shown) to form a trench 27 that exposes a predetermined surface of the Ru seed layer 25, as shown in FIG. 2D. In the process of forming the trench 27, the trench and the bottom electrode contact hole are misaligned.

In the present invention, since the Ru seed layer 25 is formed up to the upper part of the first inter-layer insulation layer 21, although misalignment is generated as above, the titanium nitride layer 24 is not exposed during the process of etching the sacrificial layer 26.

The hard mask used in the etching of the sacrificial layer 26 is removed in the subsequent process, which will be described later on.

If the adhesive layer (not shown) is formed under the sacrificial layer 26 for forming a bottom electrode, it is etched along with the sacrificial layer 26 to form a trench 27 that exposes a predetermined surface of the Ru seed layer 25. The adhesive layer is removed in a wet etching method using hydrogen peroxide solution containing sulfuric acid or ammonium peroxide.

When the trench 27 that exposes a predetermined surface of the Ru seed layer 25 is formed by etching the sacrificial layer 26 for forming a bottom electrode, there is no residue inside the trench, regardless of the presence of the adhesive layer.

Figure 2E:
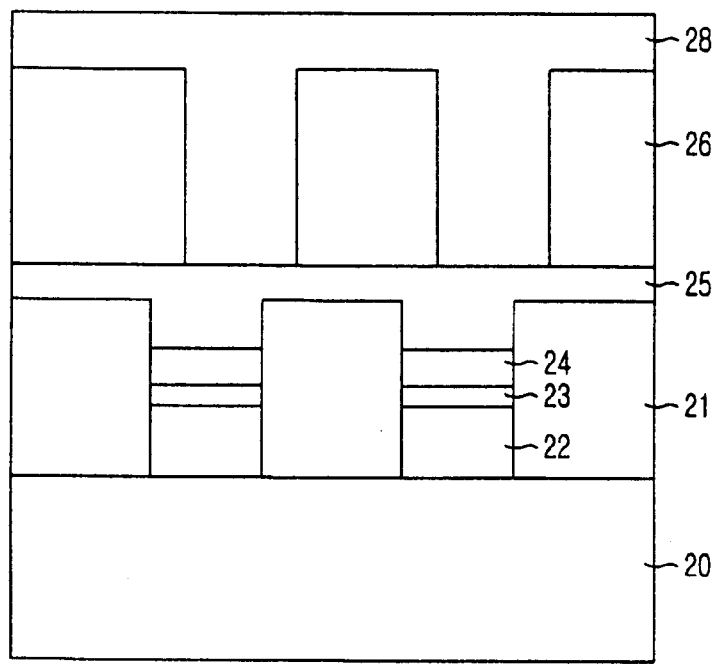

Referring to FIG. 2E, a Ru bottom electrode 28 is formed in a thickness of 5000~25000 Å on the entire structure including the trench 27 and the sacrificial layer 26 by performing electrochemical deposition. Also, the Ru bottom electrode 28 can be formed only in the trench 27 in a thickness of 4000~20000 Å by performing electrochemical deposition using electrolyte.

The thickness of the Ru bottom electrode can be controlled by controlling the total amount of the electric current used in the electrochemical deposition. In the embodiment of the present invention, the density of the electric current used here is 2~20 mA/cm$^2$ with respect to the exposed area of the seed layer. Also, in the electrochemical deposition of the embodiment of the present invention, the electric current is supplied using a direct current constant current method, pulsed direct current method, or reverse pulsed direct current method.

After the Ru bottom electrode is formed, RTP is performed at a temperature of 450~700° C. for 30 seconds to 30 minutes in the ambient of nitrogen or argon to increase the density of the Ru bottom electrode.

The Ru electrolyte used in the electrochemical deposition of the embodiment of the present invention includes a ruthenium sulfamate group, ruthenium nitrosyl sulfamate group, and alkali or acid solution containing $[RU_2N(H_2O)_2X_8]^{-3}$ wherein X is Cl, Br or I. The temperature of the electrolyte is room temperature to 95° C., and it has a pH of 1.0~5.5 or 7.5~13.

Referring to FIG. 2E, when the Ru bottom electrode 28 is formed to the upper part of the sacrificial layer 26, CMP is performed until the surface of the sacrificial layer 26 for forming a bottom electrode is exposed to etch the Ru bottom electrode 28. Here, the aforementioned hard mask (not shown) is removed during the CMP process, too.

Figure 2F:
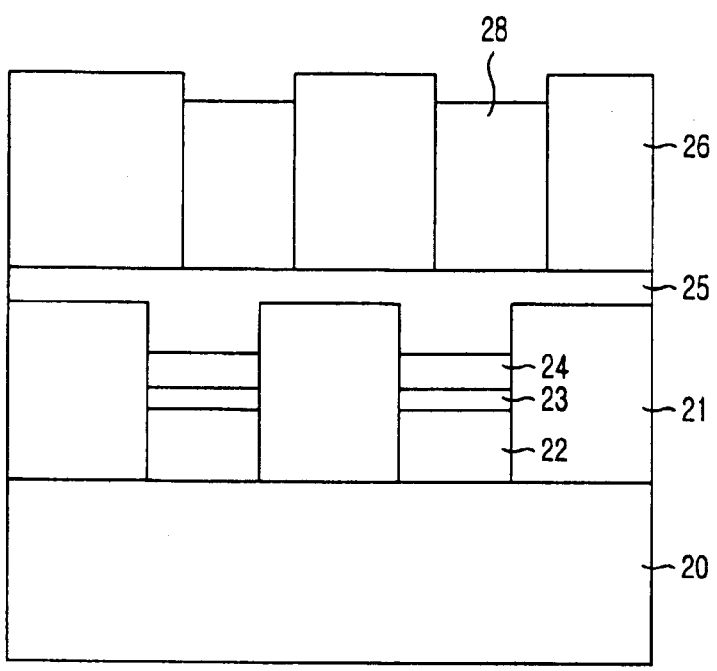

Referring to FIG. 2F, if the Ru bottom electrode 28 is formed only in the trench 27, the aforedescribed CMP needs not be performed. However, a separate wet etch or dry etch process is needed to remove the aforementioned hard mask.

Figure 2G:
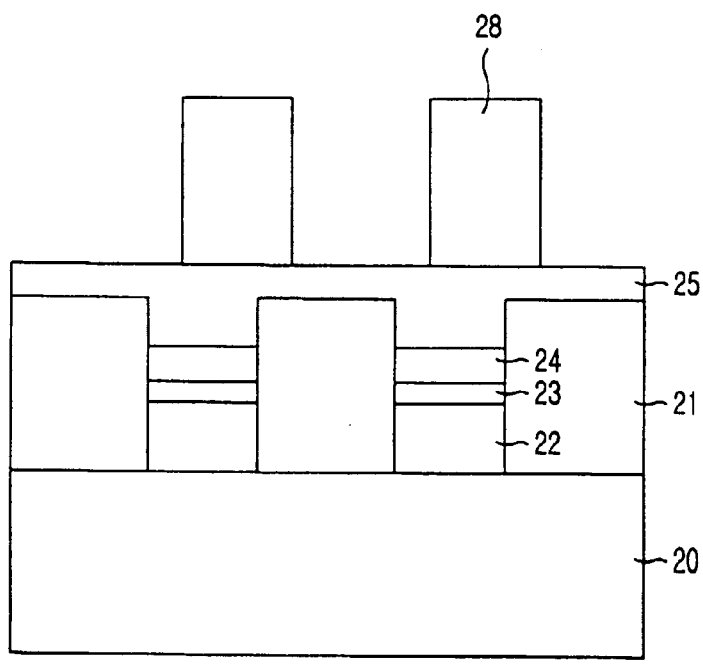

Referring to FIG. 2G, the sacrificial layer 26 for forming a bottom electrode is removed, leaving only the Ru bottom electrode 28 on the seed layer 25. In case where an adhesive layer (not shown) is formed, the adhesive layer is removed by performing wet etching for 30 seconds to 10 minutes using hydrogen peroxide solution containing sulfuric acid or ammonium peroxide, so that the Ru bottom electrode 28 should remain on the Ru seed layer 25.

When the sacrificial layer 26 for forming a bottom electrode is formed of silicon oxide, it can be removed by performing wet etching for 1~60 minutes using HF solution. In case where the sacrificial layer 26 is formed of a photoresist, it can be removed by performing dry etching in the ambient of $O_2$ or $H_2O$ in the state of plasma supplied. If the sacrificial layer 26 is formed of polymer having a low dielectric constant (low-k), it is removed by using an organic solvent.

Referring to FIG. 2G, since the Ru bottom electrode 28 is electrically conductive with the substrate through the Ru seed layer 25, a process for isolating the Ru bottom electrode 28 is required. In the embodiment of the present invention, a wet etching using CAN solution is performed to isolate the Ru bottom electrode. The CAN (cerium ammonium nitrate: $Ce(NH_4)_2(NO_3)_6$) solution which is used in the embodiment of the present invention is an aqueous solution mixed with nitric acid and deionized water. The temperature of the wet etching using the CAN solution is from room temperature and 100° C. Desirably, the CAN solution includes 1~40 w % CAN, and 0.5~30 w % nitric acid.

The aqueous solution including CAN, nitric acid and deionized water is stirred in a semiconductor fabrication apparatus. When the wafer is used by the piece, ruthenium is removed by rotating the wafer.

Figure 2H:
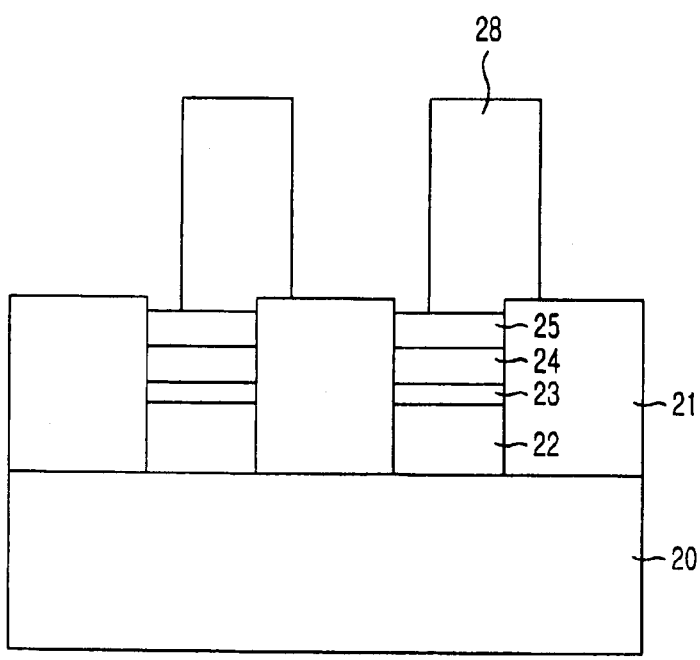
Figure 21:
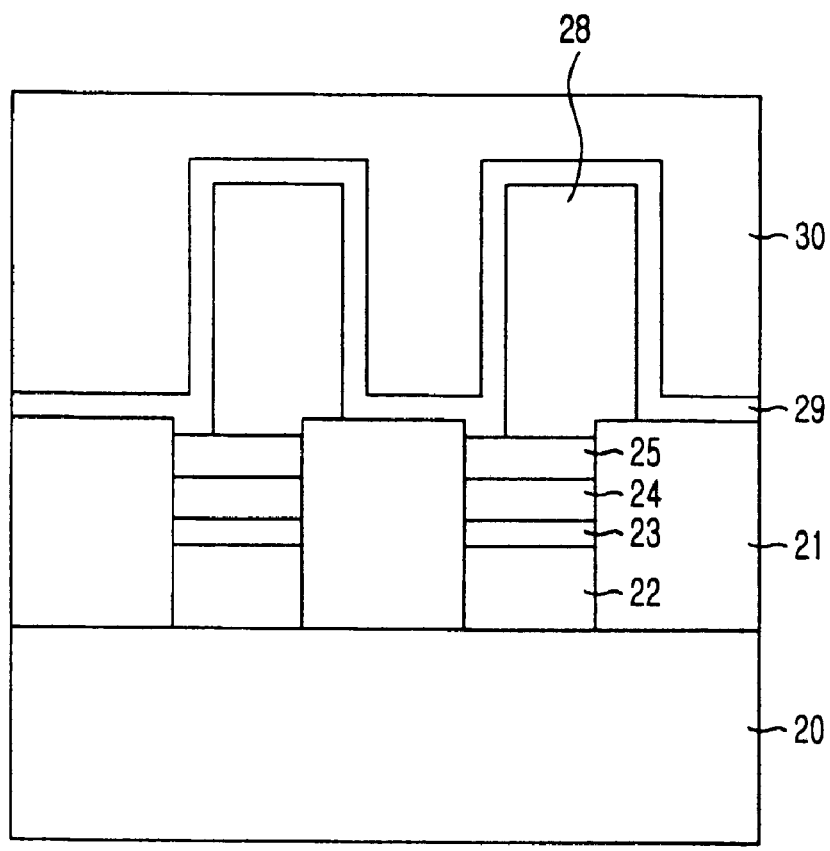

After ruthenium is removed using CAN solution, the entire structure is cleaned in diluted HF solution (HF:$H_2O$= 1:50) for 5~180 seconds to thereby obtain a bottom electrode, which is shown in FIG. 2H.

In the present invention, the space between the bottom electrodes can be widened by removing part of the surface of the Ru bottom electrode 28 along with the Ru seed layer 25. The surface thickness of the Ru bottom electrode 28 removed here is 50~500 Å.

When the space between the bottom electrodes is widened, there is an advantage that the margin for subsequent processes is secured. However, if the Ru bottom electrodes are etched too much by widening the space, the characteristics of the Ru bottom electrode can be deteriorated. Also, the thicker the Ru seed layer 25 is, the longer time it should be taken to perform wet etching using CAN solution. This means that the Ru bottom electrode 28 is etched and removed that much.

Therefore, if the Ru seed layer is etched in advance to make it thinner, the amount of etching the Ru bottom electrode 28 can be controlled during the wet etching using CAN solution. In case where the Ru seed layer is etched in advance, it is etched by performing reactive ion etching, and the amount of etching is around 50~900 Å.

As shown above, after the process of isolating the Ru bottom electrode, cleaning process is performed by dipping the entire substrate in hydrogen peroxide solution containing sulfuric acid for about 1~3 minutes to remove the residue that may exist on the surface of the Ru bottom electrode 28 or Ru seed layer.

Referring to FIG. 2I, a dielectric substance 29 and a top electrode 30 are formed successively on the Ru bottom electrode 28 to complete the process for forming a capacitor.

As for the dielectric substance, a material such as $Al_2O_3$, $Ta_2O_5$, $Ta_2O_5$—$TiO_2$, $SrTiO_3$, and $(Ba,Sr)TiO_3$, is used. It is deposited in a thickness of 80~300 Å by performing metal organic chemical deposition or atomic layer deposition.

Once the dielectric substance is formed, the substrate goes though annealing at a temperature of 400~800° C. for 10~30 minutes in the ambient of $N_2O$ or $N_2/O_2$, or it goes through plasma processing for 30 seconds to 10 minutes to improve the quality of the dielectric substance.

After annealing is performed on the dielectric substance, a top electrode 30 is formed on the dielectric substance 29. In the embodiment of the present invention, the top electrode is formed through two steps. First, a first top electrode formed of Ru, Pt or Ir is formed in a thickness of 100~300 Å by performing metal organic chemical vapor deposition or atomic layer deposition. Then, a second top electrode formed of Ru, Pt or Ir is formed additionally on top of the first electrode in a thickness of 500~1000 Å by performing sputtering. This way, the process for forming a capacitor is completed.

When the top electrodes are formed as above, the production cost can be reduced, because the thin first top electrode is formed to secure electric characteristic by performing MOCVD, which is expensive but has excellent step coverage, and then the thick second top electrode is formed by performing sputtering, which is rather cheep.

As described above, the method of the present invention is suitable for fabricating a highly integrated semiconductor device, because it uses the electrochemical deposition method when a capacitor is fabricated using a metal bottom electrode in a semiconductor device having a delicate design rule, and it can produce a capacitor electrode having an excellent step coverage. Compared with a ruthenium thin film formed in a metal organic deposition method, the capacitor electrode formed in the electrochemical deposition method can be used to make a ruthenium thin film of a better quality, thus improving the characteristics of the capacitor.

Since the method of the present invention uses a CAN aqueous solution that selectively removes ruthenium only in the etching process for isolating the bottom electrode, the quality of the bottom electrode is improved. During the etching process for isolating the bottom electrode, the space between the ruthenium bottom electrodes can be widened, thus securing the margin for subsequent processes.

While the present invention has been described with respect to certain preferred embodiments, it will be apparent to those skilled in the art that various changes and modifications may be made without departing from the scope of the invention as defined in the following claims.

What is claimed is:

1. A method for fabricating a capacitor, comprising the steps of:
   a) forming a contact hole in an insulation layer on a substrate;
   b) forming a plug including nitride in the contact hole;
   c) forming a Ru seed layer in the contact hole and on the insulation layer;
   d) forming a sacrificial layer including an open area overlapped with the contact hole on the Ru seed layer;
   e) forming a Ru layer for an electrode of the capacitor in the open area by performing electrochemical deposition;
   f) removing the sacrificial layer, whereby the Ru seed layer not covered with the Ru layer is exposed; and
   g) etching the exposed Ru seed layer by using an aqueous solution including $Ce(NH_4)_2(NO_3)_6$.

2. The method as recited in claim 1, wherein the step e) further includes the steps of:
   e1) depositing a Ru layer on the entire structure including the sacrificial layer; and
   e2) performing chemical-mechanical polishing so that the Ru layer remain only in the open area of the sacrificial layer.

3. The method as recited in claim 1, wherein the aqueous solution including $Ce(NH_4)_2(NO_3)_6$ is mixed with nitric acid and deionized water, and the wet etching is performed at a temperature of room temperature to 100° C.

4. The method as recited in claim 3, wherein the aqueous solution including $Ce(NH_4)_2(NO_3)_6$ includes 1~40 w % $Ce(NH_4)_2(NO_3)_6$ and 0.5~30 w % nitric acid.

5. The method as recited in claim 1, wherein the step g) further includes the step of:
   g1) performing a cleaning process using diluted HF solution.

6. The method as recited in claim 5, wherein the composition of the diluted HF solution is $HF:H_2O=1:50$, and the cleaning is performed for 5~180 seconds.

7. The method as recited in claim 1, wherein in the step g), the Ru seed layer is etched 50~500 Å from the surface.

8. The method as recited in claim 5, wherein the step g1) further includes the step of:
   g2) cleaning the surface of the Ru bottom electrode by using hydrogen peroxide solution including sulfuric acid.

9. The method as recited in claim 1, wherein the Ru electrolyte used in the electrochemical deposition is of a ruthenium sulfamate group, ruthenium nitrosyl sulfamate group, or alkali/acid solution including $[RU_2N(H_2O)_2X_8]^{-3}$ wherein X is Cl, Br or I.

10. The method as recited in claim 9, wherein the temperature of the electrolyte solution is in the range of from room temperature to 95° C.

11. The method as recited in claim 9, wherein the pH of the electrolyte solution is 1.0~5.5 or 7.5~13.

12. The method as recited in claim 1, wherein the density of the electric current used in the electrochemical deposition is 2~20 $mA/cm^2$ with respect to the exposed area of the seed layer.

13. The method as recited in claim 1, wherein the Ru seed layer is formed in a thickness of 500~1000 Å by performing sputtering or metalorganic chemical deposition.

14. The method as recited in claim 1, wherein the step c) further includes the step of:
   c1) performing chemical-mechanical polishing or etchback to control the thickness of the Ru seed layer, after the Ru seed layer is formed.

15. The method as recited in claim 14, wherein the Ru seed layer is removed 50~900 Å in the step of controlling the thickness of the Ru seed layer.

16. The method as recited in claim 1, wherein the step c) further includes the step of:
   c2) forming an adhesive layer on the Ru seed layer.

17. The method as recited in claim 1, wherein the step e) further includes the step of:
   e3) annealing the Ru bottom electrode.

18. The method as recited in claim 17, wherein the annealing is performed at a temperature of 450~700° C. for 30 seconds to 30 minutes in the ambient of nitrogen or argon.

* * * * *